United States Patent [19]

Klupfel et al.

[11] 4,179,292

[45] Dec. 18, 1979

[54] LIGHT-SENSITIVE COPYING COMPOSITION

[75] Inventors: Kurt-Walter Klupfel; Heide Sprengel, both of Wiesbaden, Fed. Rep. of Germany

[73] Assignee: Hoechst Aktiengesellschaft, Fed. Rep. of Germany

[21] Appl. No.: 851,875

[22] Filed: Nov. 16, 1977

[30] Foreign Application Priority Data

Nov. 17, 1976 [DE] Fed. Rep. of Germany ....... 2652304

[51] Int. Cl.$^2$ .......................... G03F 7/02; G03C 5/00; G03C 1/94; G03C 1/52
[52] U.S. Cl. ..................................... 430/175; 430/302; 430/310
[58] Field of Search ................. 96/91 R, 31, 33, 86 R, 96/36, 75

[56] References Cited

U.S. PATENT DOCUMENTS

| | | |
|---|---|---|
| 3,715,210 | 2/1973 | Watkinson et al. ................. 96/91 R |
| 3,751,257 | 8/1973 | Dahlman ............................ 96/91 R |
| 3,790,382 | 2/1974 | Dahlman ................................ 96/49 |
| 3,817,850 | 6/1974 | Feinberg ............................. 96/91 R |
| 3,840,390 | 10/1974 | Kozu et al. ......................... 96/91 R |
| 3,849,392 | 11/1974 | Steppan ................................. 96/49 |
| 3,997,344 | 12/1976 | Schlesinger ........................ 96/91 R |

*Primary Examiner*—Mary F. Kelley
*Attorney, Agent, or Firm*—James E. Bryan

[57] ABSTRACT

This invention relates to an improvement in a negative-working light-sensitive copying composition comprising at least one condensation product of a diazonium salt, at least one water-soluble synthetic polymer and at least one acrylic resin which is soluble or at least swellable in an aqueous alkaline solution, the immprovement that the water-soluble synthetic polymer is a copolymer of a $C_3$ to $C_{16}$ alkyl acrylate and an N-vinyl-N-alkyl carboxylic acid amide, the alkyl and carboxylic acid groups of which contain 1 to 6 carbon atoms each. The invention also relates to a process for the preparation of a planographic printing foil using the novel light-sensitive composition.

14 Claims, No Drawings

LIGHT-SENSITIVE COPYING COMPOSITION

This invention relates to a negative-working light-sensitive copying composition, which is, in particular, suited for the preparation of high-quality presensitized planographic printing plates and for the production of relief images, color separations, etch resists, stencils, screen printing forms, individual copies, etc. The invention further relates to a copying material produced using this light-sensitive copying composition and also to a process for the preparation of a lithographic printing plate.

Negative-working planographic printing plates, the copying layers of which function as stencils or etch resists after imagewise exposure and differentiation have been in use for a long time, and they are commercially available as plates for a reversal process, sometimes called "reversal plates" or "deep etch plates", and in the form of presensitized bimetal and trimetal plates. On the other hand, solutions or emulsions of light-sensitive copying compositions are available which may be used for coating single metal, bimetal and trimetal carriers, so that a planographic printing plate desired for a particular purpose can be prepared on the spot at the processing plant.

A commercially available reversal plate is processed as follows:

The reversal plate which is composed of a light-hardenable copying layer on a metal plate serving as a carrier is first exposed to light under a positive original. Then the unexposed and thus non-hardened image areas are removed by wiping with a developer. The parts of the carrier surface laid bare by wiping are treated with a metal etching solution, i.e. they are deep etched. After drying, the entire surface of the plate is covered with a thin lacquer layer which is receptive to printing ink; the plate is again dried and dyed with a greasy protective ink. For removing the exposed and hardened areas of the copying layer, together with the lacquer and ink adhering thereto, the plate is treated with a suitable stripping solution. By this treatment the lacquer portions adhering directly to the etched carrier are not affected. Following wiping of the bared carrier surface, e.g., with dilute phosphoric acid, the reversal plate is ready for printing.

However, the reversal plates heretofore used show various disadvantages during processing. Deep etching of the plate surface after developing is an expensive process step which, in addition, does not produce the required uniformity of depth and degree of roughening when large areas are treated, so that good results are not obtained with sufficient reliability.

Further, stripping of the known planographic printing plates yields relatively poor results and is time-consuming, especially when there is a very strong bond between the lacquer and the hardened copying layer areas, so that an attack of the stripping solution is made difficult or even impossible. This means that aggressive mixtures of potassium permanganate and hydrogen peroxide must be used as stripping agents.

It is, therefore, difficult to match the copying layer and the processing agents in such a manner that optimum results are obtained.

Orginally, the copying layers used with reversal plates, bimetal plates and trimetal plates contained chromates as sensitizers and gum arabic, fish glue or bone glue as colloids. However, layers of this composition have the disadvantage that they possess poor storability because of the so-called "dark reaction". An identical instability is observed in chromate-sensitized polyvinyl alcohol layers.

Improved storability resulted from the use of synthetic water-soluble colloids, such as polyvinyl pyrrolidone, polyvinyl alcohol, polyvinyl methyl ether etc. as binders combined with diazo resins, i.e. condensation products of p-diazodiphenylamine and paraformaldehyde. However, hardening obtained on exposure of these layers did not always prove adequate. The hardened image areas showed only a limited resistance to the great number of processing steps following exposure. Further, these layers which were composed of solely water-soluble colloids were susceptible to finger marks, in particular in case of high atmospheric moisture.

In German Offenlegungsschrift No. 1,772,947, planographic printing plates for the deep etch process are described, in which special hardenable resins, e.g., a modified copolymer of acrylic acid/acrylic acid amide or a polymethacrylate are used together with diazo resin compounds serving as light-sensitive substances.

These plates have the disadvantage that after development according to the known processes it is necessary to deep etch the carrier surface by an additional etching step in order to improve the adhesion of a lacquer which is applied to the carrier surface in a subsequent processing step and thus to ensure long runs. As a consequence, processing of the plates is time-consuming and expensive. It is also a disadvantage that the hardened copying layer only inadequately repels the applied lacquer; it forms a relatively strong bond with this lacquer so that stripping is made difficult.

It is an object of the present invention to provide a light-sensitive copying composition which is, in particular, suited for the preparation of high-quality, presensitized negative-working planographic printing plates and which permits a simplified processing of the planographic printing plates, so that good results are repeatedly obtained. It is further an object of the invention to provide a complete and deep cleansing of the highly porous carrier surface in the course of development of the exposed planographic printing plate, so that an etching operation separate from development can be omitted.

This object is achieved by the negative-working light-sensitive copying composition of the invention. It comprises as a light-sensitive component a diazonium salt condensation product and as a binder a water-soluble synthetic polymer and an acrylic resin insoluble in water, which is soluble or at least swellable in an alkali. In addition, the copying layer may contain pigments, dyes, plasticizers, color couplers, and similar known additives.

The water-soluble synthetic polymer used for the preparation of the light-sensitive copying composition according to the invention is a copolymer of an N-vinyl-N-alkyl carboxylic acid amide, the alkyl and the carboxylic acid radicals of which contain 1 to 6 carbon atoms each, and a $C_3$ to $C_{16}$ alkyl acrylate having a branched or straight-chain alkyl radical.

The following N-vinyl compounds are exemplary of the N-vinyl-N-alkyl carboxylic acid amide:

Vinyl-N-methyl formamide, vinyl-N-ethyl formamide, vinyl-N-propyl formamide, vinyl-N-butyl formamide, vinyl-N-methyl acetamide, vinyl-N-ethyl acetamide, vinyl-N-propyl acetamide, vinyl-N-butyl acetamide, vinyl-N-methyl propionamide, vinyl-N-ethyl propionamide, vinyl-N-propyl propionamide, vinyl-N-butyl propionamide, vinyl-N-methyl-n-butyramide, vinyl-N-ethyl-n-butyramide, vinyl-N-propyl-n-butyramide, and vinyl-N-butyl-n-butyramide.

Vinyl N-methyl acetamide is preferred.

The second component of the copolymer, an alkyl acrylate, is, e.g., one of the following monomers:

n-butyl acrylate, n-pentyl acrylate, n-hexyl acrylate, n-octyl acrylate, 2-ethyl hexyl acrylate, and 3,5,5-trimethyl hexyl acrylate.

2-ethyl hexyl acrylate is preferred.

In general, copolymers containing N-vinyl-N-alkyl carboxylic acid amide in an amount ranging between about 80 and 99.5 percent by weight are suitable. Particularly advantageous are copolymers containing about 90 to 99 percent by weight of vinyl-N-alkyl carboxylic acid amide.

The water-soluble synthetic polymer is, especially, a copolymer of vinyl-N-methyl acetamide and 2-ethyl hexyl acrylate. Preferably, it has a K-value of between 45 and 50, measured as a 1 percent solution in methanol. It is soluble in water, in acids and in organic solvents, e.g., alchols, ketones, polyglycols and ethylene glycol methyl ether acetate; in aqueous alkaline solutions swelling is observed. It is, to a large extent, compatible with the acrylic resins additionally used according to the invention.

The K-value is a technical measure of the average degree of polymerization of a polymer:

$$K\text{-value} = 1000 \cdot k$$

Where:
$k = (1.5 \lg z - 1 \pm \sqrt{1 + (200/c + 2 + 1.5 \lg z)1.5 \lg z})/(150 + 3c)$ $z = \eta/\eta_o$; $\eta$ = viscosity of the solution, $\eta_o$ = viscosity of the solvent, $c$ = concentration of the solution in g/100 ml.

As acrylic resins insoluble in water, which are soluble or at least swellable in an alkali, copolymers of methacrylic acid and at least one alkyl methacrylate are suitable, with the alkyl methacrylate or at least one of the alkyl methacrylates having an alkyl group containing 1 to 15 carbon atoms. Preferably, this binder is a copolymer of methacrylic acid and a $C_1$ to $C_{15}$ alkyl methacrylate, in particular of methacrylic acid and methyl or ethyl methacrylate in weight ratios ranging between 10:90 and 25:75 (relative to the monomers used). Also preferred are terpolymers of methacrylic acid and two different $C_1$ to $C_{15}$ alkyl methacrylates, one of these being, in particular, methyl or ethyl methacrylate. Especially advantageous are terpolymers of methacrylic acid, methyl or ethyl methacrylate and a $C_4$ to $C_8$ alkyl methacrylate, such as n-hexyl methacrylate, e.g., in weight ratios ranging between 16:13:71 and 26:15:59, as described in German Offenlegungsschrift No. 2,064,080, or U.S. Pat. No. 3,804,631.

Apart from the copolymers and terpolymers mentioned above, the acrylic resin which is soluble or at least swellable in an alkali may be a terpolymer of (A) an unsaturated carboxylic acid, (B) a $C_1$ to $C_{20}$, preferably a $C_4$ to $C_{12}$ alkyl methacrylate and (C) a further monomer copolymerizable with (A) and (B), the corresponding homopolymer of which has a glass transition temperature of at least 80° C. These copolymers are known from German Offenlegungsschrift No. 2,363,806, or from U.S. Pat. No. 3,930,865.

As the component (C) of this terpolymer the following compounds are among others which are suitable:

Styrene or a substituted styrene, e.g., vinyl toluene, p-chlorostyrene, α-chlorostyrene, α-methylstyrene, vinyl ethyl-benzene, o-methoxystyrene and m-bromostyrene; vinyl naphthalene or a substituted vinyl naphthalene; a vinyl heterocycle, such as N-vinyl carbazole, vinyl pyridine, and vinyl oxazole; a vinyl cycloalkane, e.g., vinyl cyclohexane, 3,5-dimethyl-vinyl cyclohexane, acrylamide, methacrylamide, N-alkyl acrylamide, acrylonitrile, methacrylonitrile, aryl methacrylate, aralkyl methacrylate, etc.

A preferred embodiment of the copying composition according to the invention contains a terpolymer in which the component (C) is styrene, p-chlorostyrene, vinyl toluene, vinyl cyclohexane, acrylamide, methacrylamide, N-alkyl acrylamide, phenyl methacrylate, acrylonitrile, methacrylonitrile or benzyl methacrylate. Of these, styrene is particularly preferred.

As unsaturated carboxylic acids (A) methacrylic acid, acrylic acid, crotonic acid, sorbic acid or maleic acid or itaconic acid or their monoesters are preferably used. Methacrylic acid is particularly preferred.

Particularly preferred are terpolymers of (A), (B) and (C) in the weight ratios of 25:67:8 to 35:53:12.

It is further possible that the binder copolymer contains, apart from the components (A), (B) and (C), another alkyl methacrylate which is copolymerizable with these components and which may contain in its alkyl group a number of carbon atoms different from (B). As a matter of fact, all of the components (A), (B), and (C) may be present by several of their representatives.

Binders comprising four monomeric units are, e.g., preferred when a fine adjustment of certain properties, such as adhesion of the copying composition to newly developed alloys, is required.

Of the acrylic resins mentioned, which are soluble or at least swellable in an alkali, the polymers with acid numbers ranging between 60 and 200 and molecular weights ranging between 20,000 and 50,000 are particularly suitable.

Suitable light-sensitive condensed diazonium compounds are in particular condensates of diazotized p-amino diarylamines with compounds containing carbonyl groups, e.g., aldehydes, preferably formaldehyde, or with aldehyde donors, e.g. paraformaldehyde. These and similar compounds are disclosed in German Pat. No. 1,214,086, or U.S. Pat. No. 3,235,384 and in U.S. Pat. Nos. 2,922,715 and 2,946,683. Particularly preferred are condensation products of diazotized p-amino diphenylamine and paraformaldehyde, which are free from metal salts, corresponding to German Pat. No. 1,214,086, or U.S. Pat. No. 3,235,384. Further, the diazonium condensates described in German Offenlegungsschriften Nos. 2,024,242; 2,024,244, and 2,041,395, are suitable. These condensation products comprise at least one unit each of the general types $A(-D)_n$ and B, which are interconnected by bivalent intermediate members derived from a carbonyl compound capable of condensation.

As the components $A(-D)_n$ and B pratically any compounds may be used which are capable of reaction, by condensation, with active carbonyl compounds, in an acid medium and which are not decomposed by the conditions of the condensation reaction.

Where:
A is a radical of a compound containing at least two isocyclic or heterocyclic aromatic rings and which, in an acid medium, is in at least one position of its molecule condensable with an active carbonyl compound, D is a diazonium salt group which is linked to an aromatic carbon atom of A, n is an integer between 1 and 10, B is a radical of a compound free from diazo groups, which is, in an acid medium, in at least one position of its molecule capable of condensation with an active carbonyl compound, in particular a radical of an aromatic amine, a phenol, a phenol ether, an aromatic thioether, an aromatic hydrocarbon, an aromatic heterocyclic compound or an organic acid amide.

The anion of the diazonium salt is preferably derived from an aliphatic monosulfonic acid having from 1 to 6 carbon atoms. Condensates of a 3-alkoxy-diphenylamine-4-diazonium salt and a derivative of diphenyl ether, diphenyl sulfide, diphenyl methane or diphenyl are equally preferred.

A great number of examples of diazo condensates of these kinds are given in German Offenlegungsschriften Nos. 2,024,242; 2,024,244; and 2,041,395, already mentioned.

The preferred part-by-weight ranges of the individual components of the copying composition are approximately as follows:

0.2 to 1.5 parts by weight of a diazo condensate,
0.1 to 5.0 parts by weight of the acrylic resin,
0.5 to 4.0 parts by weight of the water-soluble synthetic polymer and, if required,
0.01 to 0.175 part by weight of a dye.

The added dyes preferably act as contrast agents. Blue dyes are best suited which, together with the yellow diazonium condensate, impart a green color to the copying layer. This combination has the advantage that upon exposure a clear image contrast is obtained, which substantially reduces or even eliminates the risk of a double exposure in practice.

Suitable dyes are compounds which are soluble in organic solvents, e.g., those belonging to the class of azo or triphenyl methane dyes. A preferred dye is a coupling product of 2,4-dinitro-6-chlorobenzene diazonium salt with 2-methoxy-5-acetylamino-N-cyanoethyl-N-hydroxyethyl aniline.

The negative-working copying materials are produced in known manner. The coating solution composed of the components of the copying composition and a suitable solvent or solvent mixture is applied by casting, spraying, immersion, application with rollers etc., so as to form a film on the intended carrier, which is subsequently dried.

The carrier materials used for the reversal plate are generally zinc or aluminum or laminates of zinc and polyester. In order to obtain long runs it is advantageous to use a metal carrier with improved adhesion, e.g., mechanically, chemically or electrolytically roughened and anodized aluminum with an aluminum oxide weight of at least 3 g/m$^2$.

The process for the preparation of a planographic printing form using the copying material according to the invention is, in detail, as follows:

The copying material is exposed in the actinic range under a positive original and is developed with a suitable developer.

Preferred developers are aqueous alkaline solutions, e.g., of alkali phosphates, alkali silicates or alkali borates, to which small quantities of miscible organic solvents may be added, if required. The pH value of the solutions is preferably between 8 and 10. For special compositions small additions of suitable anionic wetting agents, such as sodium lauryl sulfate or ammonium alkyl sulfate, have proved successful. It is also possible to use solely developer mixtures composed of deionized water and an organic solvent miscible with water, with the addition of small quantities of wetting agents, if required.

After thoroughly rinsing with water, the plate is completely dried and, if necessary, the film edges or defective areas are corrected by means of a masking lacquer. In order to ensure long runs, the subsequently applied lacquer is preferably dried for 10 minutes at 50° to 60° C. and, if necessary, the plate is treated with a protective ink. Then, any surplus lacquer and ink are removed by brisk brushing under water and subsequently the hardened portions of the copying layer are removed by treating with a stripper.

As strippers, aqueous alkaline solutions likewise may be used. They differ from the corresponding developers in that they have higher pH values.

Finally, the surface of the plate is acidified or made hydrophilic, preferably using dilute phosphoric acid, and, if required, it is coated or preserved with a protective ink. Then the plate is ready for printing.

If the above procedure is appropriately modified the copying composition according to the invention, among others, also may be used for the preparation of a printing form on a multi-metal carrier, e.g. a trimetal carrier.

For this purpose, the presensitized planographic printing plate comprising the copying composition according to the invention and a multi-metal carrier, e.g., a chromium/copper/aluminum carrier, is exposed under a positive original; the non-hardened image areas are removed by treatment with a developer; the bared carrier surface is etched with a chromium etching solution until the copper appears; the copper surface is preferably activated by treatment with compounds producing oleophilic properties and, finally, the image areas hardened by the light are removed with an alkaline solution. Following treatment of the imagewise modified carrier surface, preferably with dilute phosphoric acid, the planographic printing plate is ready for printing.

Carriers composed of copper/aluminum or brass/chromium are generally used for bimetal plates, whereas for trimetal plates carriers of aluminum/copper/chromium or steel/copper/chromium are generally used.

In addition, printed circuits may be prepared using the copying composition according to the invention. In this case, processing is carried out as is usual for the preparation of bimetal plates: Following exposure under a negative original the material is developed and then etched and stripped. Carriers used for the preparation of printed circuits may be laminates of copper and a moulding material of phenolic resin, or copper and a glass fiber reinforced epoxy resin or copper and a polyimide.

As compared to the conventional copying compositions and negative-working planographic printing plates the copying compositions and plates according to the present invention as well as the method suggested for their processing have the following advantages:

The copying layer may be developed without residue by means of aqueous solutions which contain only very small amounts of organic compounds and which, in addition, are ecologically acceptable. As a consequence, no deep etching of the carrier surface is required after development; the copying layer is not susceptible to finger marks, it is extremely well suited for storing, and in the light-hardened condition it may be stripped without residue using aqueous alkaline solutions.

In contrast to the stripping method at present employed in the graphic trade, involving the use of potassium permanganate and $H_2O_2$ mixtures, this stripping method is to a higher degree ecologically acceptable and is thus less problematic.

The copying composition and the copying material prepared with this copying composition as well as the method for processing this material are further illustrated by the examples which follow. Unless otherwise stated, the percentages and quantities specified in the examples are by weight. The relation between parts by weight and parts by volume corresponds to that between g and ml.

EXAMPLE 1

To an electrochemically roughened and anodized aluminum surface with an oxide layer of 3 g/m$^2$ a solution of the following composition is applied:

1.34 parts of a terpolymer containing 62.5 percent of n-hexyl methacrylate, 12.5 percent of methyl methacrylate and 25 percent of methacrylic acid having an acid number of 155, 4 parts of a copolymer containing 98 percent of N-vinyl-N-methyl acetamide and 2 percent of 2-ethyl-hexyl acrylate having a K-value of 45 to 50, measured as a 1 percent solution in methanol, 0.53 part of a polycondensate of p-diazodiphenylamine and paraformaldehyde, as described in Example 1 of German Pat. No. 1,214,086, or U.S. Pat. No. 3,235,384. (For this purpose, approximately 42 parts of an 85 percent phosphoric acid, 3.3 parts of paraformaldehyde and 23 parts of diphenylamine-4-diazonium chloride are stirred in at room temperature. The resulting viscous solution is stirred for 30 minutes at room temperature. Subsequently, it is heated to 40° C. during 24 hours.)

0.04 part of a dye obtained by coupling 2,4-dinitro-6-chloro-benzene diazonium salt with 2-methoxy-5-acetylamino-N-cyanoethyl-N-hydroxyethylaniline, 4.06 parts of methyl ethyl ketone, and 90.03 parts of ethylene glycol monomethyl ether.

The solution is applied by casting or whirler-coating in such a manner that a dry layer weighing 2.8 to 3 g/m$^2$ is obtained.

Subsequently, the plate is dried for 2 minutes at 100° C. Following an exposure of 35 seconds under a positive original with a Xenokop (capacity 8 kW, distance 80 cm, model BIKOP of Messrs. Klimsch, Neu-Isenburg) the exposed plate is developed for one minute, using a plush pad, with a developer of the following composition:

3 parts of n-propanol, 0.05 part of sodium lauryl sulfate as a wetting agent, and 96.95 parts of deionized water, so that a negative image of the original is obtained.

After thoroughly rinsing with water, the plate is dried for 10 minutes at 50° C.

Subsequently, possible film edges or defective areas are corrected, e.g., by means of "Abdeckfarbe-Rot" of Messrs. EGGEN-Hannover. Following drying of the correcting agent, e.g., under a hot-air blower, the plate is coated with a lacquer. Any commercially available lacquers may be used, such as "Hacolac" of Messrs. Hausleiter (Munich), "EGGEN-Stabil-Lack" of Messrs. EGGEN-Hannover, "Rubilac 9" of Messrs. IMG (Verona, Italy) and "Krause-Alu-Emaille-Lack" of Messrs. Krause (Bielefeld).

The lacquer is dried for 10 minutes at 50° to 60° C. in a drying chamber. Then, various protective inks may be applied, such as "Schutzfarbe S" (EGGEN), "Haco-Pos. Fettfarbe" (Hausleiter) or "RC 43" (KALLE). Prior to stripping, any surplus lacquer and greasy ink are removed by brushing in water.

The light-hardened stencil is then stripped using a solution of the following composition:

9 parts of completely softened water, 5.3 parts of sodium metasilicate.9 $H_2O$, 3.4 parts of tert. sodium phosphate.12 $H_2O$, and 0.3 part of sec. sodium phosphate.

Subsequently, the plate is acidified with a 1 percent phosphoric acid and then preserved.

On a (Multilith 1850) printing machine approximately 150,000 flawless prints without loss of tone value were produced.

EXAMPLE 2

A solution of:

1.78 parts of a terpolymer binder of styrene, n-hexyl methacrylate and methacrylic acid in a ratio of 10:60:30, having an acid number of 195 to 200, 3.56 parts of a copolymer as described in Example 1, 1 part of a diazonium mixed condensate of 1 mole of 3-methoxy-diphenylamine-4-diazonium sulfate and 1 mole of 4,4'-bis-methoxy methyl-diphenylether, prepared in an 85 percent phosphoric acid and isolated as methane sulfonate, 0.1 part of the dye described in Example 1, in 94 parts of ethylene glycol monomethyl ether, is applied to an electrochemically roughened and anodized aluminum plate with the aid of casting device in such a manner that after drying in a stream of warm air a layer weighing about 2.5 g/m$^2$ is obtained.

Subsequently, the plate is exposed for approximately 30 seconds under a positive original using a metal halide lamp with a capacity of 5 kW, positioned at a distance of 140 cm.

The image areas which are not cross-linked are washed out using a plush pad with a developer of the following composition:

0.8 part of polyethylene glycol 200, 0.6 part of sodium lauryl sulfate, and 98.6 parts of deionized water.

After thoroughly rinsing with water, the plate is dried for 10 minutes at 50° C. The plate is further processed as described in Example 1, preferably using "Abdecklack-Rot" of Messrs. EGGEN as a masking lacquer and "EGGEN-Kopierlack-Stabil" as a lacquer.

The light-hardened stencil is stripped using the same solution as in Example 1. Up to 150,000 copies are printed with these plates.

EXAMPLE 3

A solution of:

4 parts of a terpolymer of n-hexyl methacrylate, methyl methacrylate and methacrylic acid in a ratio of 62.5:12.5:25, having an acid number of about 160, 1 part of a copolymer as described in Example 1, 1 part of a polycondensate of p-diazo-diphenylamine with paraformaldehyde, as described in Example 1,
0.075 part of the dye described in Example 1, in
15 parts of methyl ethyl ketone, and
70 parts of ethylene glycol monomethyl ether, is whirler-coated on a trimetal plate composed of Fe/Cu/Cr in such a manner that a layer weighing about 2 g/m$^2$ is obtained. The plate is dried for 2 minutes at 100° C.

Subsequently, the coated plate is exposed for 150 seconds under a positive original using a Xenokop (capacity 8 kW, distance 80 cm, model BIKOP of Messrs. Klimsch, Neu-Isenburg), and developed with a developer of the following composition:
70 parts of completely softened water,
25 parts of n-propanol,
5 parts of MgSO$_4$.7H$_2$O, and
0.5 part of lauryl polyglycol ether.

The plate is rinsed with water and dried with the aid of a fan.

The developed plate is then treated with a solution of:
17.4 percent of calcium chloride, 35.3 percent of zinc chloride, 2.1 percent of hydrogen chloride and 45.2 percent of water, until the copper in the developed image areas is entirely bared. It is again rinsed with water and the light-hardened stencil (etch resist) is removed with a stripper, as described in Example 2.

After rubbing the plate with a conventional activator, such as sulfuric acid or mercapto compounds, in order to render the copper surface oleophilic, the plate is rinsed with water and then a greasy ink is applied.

EXAMPLE 4

A solution of:
1 part of a terpolymer of n-hexyl methacrylate, methyl methacrylate and methacrylic acid in a ratio of 62.5:12.5:25, having an acid number of about 160,
4 parts of a copolymer containing 91 percent of N-vinyl-N-methyl acetamide and 9 percent of 2-ethyl hexyl acrylate, having a K-value of 70, measured as a 1 percent solution in methanol,
0.8 part of a polycondensate of p-diazo diphenyl-amine with paraformaldehyde, according to Example 1,
0.175 part of the dye described in Example 1, in
3.2 parts of methyl ethyl ketone, and
90.83 parts of ethylene glycol monomethyl ether, is applied to an electrochemically roughened and anodized aluminum plate with an oxide layer of 10 g/m$^2$ by casting or whirler-coating in such a manner that a layer weighing 2.2 g/m$^2$ is obtained.

The plate is then dried for 2 minutes at 100° C. Following exposure for about 30 seconds under a positive original using the lamp described in Example 2 positioned at a distance of 140 cm, the unexposed image areas are washed out with a 1 percent phosphoric acid, and the plate is rinsed with water.

The developed plate is dried for 10 minutes at 50° C., and is then further processed as described in Example 1. 70,000 to 80,000 flawless prints are obtained.

EXAMPLE 5

A solution of:
1.78 parts of a copolymer of methyl methacrylate/-methacrylic acid in a weight ratio of 90:10, having an acid number of 65 and an average molecular weight of 30,000,
3.56 parts of a copolymer as described in Example 1,
0.40 part of a polycondensate of p-diazo diphenyl-amine and paraformaldehyde as described in Example 1,
0.40 part of the dye described in Example 1, in
60 parts of ethylene glycol monomethyl ether is whirler-coated on an electrochemically roughened and anodized aluminum plate in such a manner that a layer weighing approximately 2.8 g/m$^2$ is obtained. The plate is dried for two minutes at 100° C. Following an exposure of 45 seconds under a positive original by means of a Xenokop (capacity 8 kW, distance 80 cm, model BIKOP of Messrs. Klimsch, Neu-Isenburg) the exposed plate is developed during 45 seconds, using a plush pad, with a developer composed of:
5 parts of n-propanol, and
95 parts of deionized water,
so that a negative image of the original is obtained.

The plate is further processed as described in Example 1.

EXAMPLE 6

A solution of the following composition:
1.34 parts of a copolymer of methyl methacrylate/-methacrylic acid in a weight ratio of 80:20, having an acid number of 120 and an average molecular weight of 35,000,
4 parts of a copolymer as described in Example 1,
0.5 part of a polycondensate of p-diazo diphenyl-amine and paraformaldehyde as described in Example 1,
0.04 part of the dye described in Example 1, in
65 parts of ethylene glycol monomethyl ether, is applied to an electrochemically roughened and anodized aluminum plate in such a manner that a layer weighing approximately 3 g/m$^2$ is obtained.

The plate is further processed as described in Example 1. The exposed plate is treated with the following developing solution:
3 parts of n-propanol,
0.06 part of sodium lauryl sulfate
0.01 part of antifoaming solution T (see Karsten Lackrohstofftabellen, 5th Edition, page 415).

The plate is further processed as described in Example 1.

Approximately 100,000 prints are obtained.

EXAMPLE 7

A plate of a copper-phenoplast laminate cleaned with pumice powder and thoroughly rinsed with water is first dried with a blower and then dried for 10 minutes at 100° C.

Subsequently, the plate is whirler-coated with a solution of:
4.25 parts of a terpolymer of n-hexyl methacrylate, methyl methacrylate and methacrylic acid in a ratio of 62.5:12.5:25, having an acid number of about 160,
0.75 part of a copolymer as described in Example 1,
0.4 part of a polycondensate of p-diazodiphenylamine and paraformaldehyde, as described in Example 1,
0.04 part of the dye as described in Example 1, in
60 parts of ethylene glycol monomethyl ether, in such a manner that a layer weighing approximately 4 g/m$^2$ is obtained.

The layer is pre-dried for 1 minute in warm air, and the plate is then placed for 2 minutes in a drying chamber at a temperature of 100° C.

Following an exposure of 60 seconds under a negative original using a Xenokop (capacity 8 kW, distance 80 cm, model BIKOP) the unexposed image areas are removed with a developer of the following composition:

220 parts of deionized water,
35 parts of n-propanol,
6.5 parts of $MgSO_4.7H_2O$, and
0.7 part of lauryl polyglycol ether.

After thoroughly rinsing with water the layer is subjected to a compressed air stream, and subsequently the bared copper is etched in an etching machine using a ferric chloride solution of 42° Bé, with the hardened image areas serving as an etch resist.

Following stripping of the cross-linked layer areas with acetone the desired circuit path image is obtained.

It will be obvious to those skilled in the art that many modifications may be made within the scope of the present invention without departing from the spirit thereof, and the invention includes all such modifications.

What is claimed is:

1. In a negative-working light-sensitive copying composition comprising at least one condensation product of a diazonium, salt, at least one water-soluble synthetic polymer, and at least one acrylic resin having an acid number between 60 and 200 and which is soluble in an aqueous-alkaline solution, the weight ratio of water-soluble synthetic polymer and acrylic resin being within the limits of 10:90 and 90:10,
   the improvement that the water-soluble synthetic polymer is a copolymer of a $C_3$ to $C_{16}$ alkyl acrylate and an N-vinyl N-alkyl carboxylic acid amide, the alkyl and carboxylic acid groups of which contain 1 to 6 carbon atoms each.

2. A copying composition in accordance with claim 1 in which the water-soluble polymer is a copolymer of N-vinyl-N-methyl acetamide and 2-ethyl hexyl acrylate.

3. A copying composition in accordance with claim 1 in which the acrylic resin is a copolymer of methacrylic acid and at least one $C_1$ to $C_{15}$ alkyl methacrylate.

4. A copying composition in accordance with claim 3 in which the acrylic resin is a copolymer of methacrylic acid and methyl methacrylate or ethyl methacrylate.

5. A copying composition in accordance with claim 3 in which the acrylic resin is a terpolymer of methacrylic acid, methyl methacrylate or ethyl methacrylate, and a $C_4$ to $C_{15}$ alkyl methacrylate.

6. A copying composition in accordance with claim 5 in which the alkyl methacrylate is butyl methacrylate or hexyl methacrylate.

7. A copying composition in accordance with claim 1 in which the acrylic resin is a copolymer of (A) an unsaturated carboxylic acid, (B) a $C_1$ to $C_{20}$ alkyl methacrylate and (C) a further monomer copolymerizable with (A) and (B), the corresponding homopolymer of which has a glass transition temperature of at least 80° C.

8. A copying composition in accordance with claim 7 in which the acrylic resin is a copolymer of methacrylic acid, n-hexyl methacrylate, and styrene.

9. A copying composition in accordance with claim 1 in which the acrylic resin has a molecular weight ranging between 20,000 and 50,000.

10. A copying composition in accordance with claim 1 in which the composition further contains pigments, dyes, plasticizers or color couplers.

11. In a light-sensitive copying material composed of a carrier and a light-sensitive layer comprising at least one condensation product of a diazonium salt, at least one water-soluble synthetic polymer and at least one acrylic resin having an acid number between 60 and 200 and which is soluble in an aqueous-alkaline solution, the weight ratio of water-soluble synthetic polymer and acrylic resin being within the limits of 10:90 and 90:10,
   the improvement that the water-soluble synthetic polymer is a copolymer of a $C_3$ to $C_{16}$ alkyl acrylate and an N-vinyl-N-alkyl carboxylic acid amide, the alkyl and carboxylic acid groups of which contain 1 to 6 carbon atoms each.

12. A process for the preparation of a planographic printing form using a light-sensitive copying material composed of a carrier and a light-sensitive layer which comprises exposing the light-sensitive layer under a positive original, removing the non-hardened image areas by treatment with a developer, coating the imagewise bared carrier surface with an alkali-resistant ink-receptive lacquer, dyeing the entire surface with a protective ink and subsequently treating it with water while brushing, and removing the light-hardened image areas with an alkaline solution, said light-sensitive layer comprising at least one condensation product of a diazonium salt, at least one copolymer of a $C_3$ to $C_{16}$ alkyl acrylate and an N-vinyl-N-alkyl carboxylic acid amide, the alkyl and carboxylic acid groups of which contain 1 to 6 carbon atoms each, and at least one acrylic resin having an acid number between 60 and 200 and which is soluble in an aqueous-alkaline solution, the weight ratio of water-soluble synthetic polymer and acrylic resin being within the limits of 10:90 and 90:10.

13. A process accordng to claim 12 including rendering the bared carrier surface hydrophilic.

14. A process for the preparation of a planographic printing form which comprises exposing a light-sensitive layer, on a multi-metal carrier composed of chromium/copper/aluminum, under a positive original,
   said light-sensitive layer comprising at least one condensation product of a diazonium salt, at least one copolymer of a $C_3$ to $C_{16}$ alkyl acrylate and an N-vinyl-N-alkyl carboxylic acid amide, the alkyl and carboxylic acid groups of which contain 1 to 6 carbon atoms each,
   and at least one acrylic resin having an acid number between 60 and 200 and which is soluble in an aqueous-alkaline solution, the weight ratio of water-soluble synthetic polymer and acrylic resin being within the limits of 10:90 and 90:10,
   removing the non-hardened image areas by treatment with a developer,
   etching the bared carrier surface with a chromium etching solution until the copper appears,
   and removing the light-hardened image areas with an alkaline solution.

* * * * *